United States Patent
Balasekaran et al.

(10) Patent No.: US 9,583,654 B2
(45) Date of Patent: Feb. 28, 2017

(54) LIGHT RECEIVING DEVICE AND IMAGE SENSOR

(71) Applicant: SUMITOMO ELECTRIC INDUSTRIES, LTD., Osaka (JP)

(72) Inventors: Sundararajan Balasekaran, Yokohama (JP); Yasuhiro Iguchi, Yokohama (JP); Hiroshi Inada, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/976,303

(22) Filed: Dec. 21, 2015

(65) Prior Publication Data

US 2016/0197214 A1 Jul. 7, 2016

(30) Foreign Application Priority Data

Jan. 5, 2015 (JP) .................................. 2015-000434

(51) Int. Cl.
  *H01L 27/146* (2006.01)
  *H01L 31/0304* (2006.01)
  *H01L 31/0352* (2006.01)

(52) U.S. Cl.
  CPC .... *H01L 31/03042* (2013.01); *H01L 27/1464* (2013.01); *H01L 27/1465* (2013.01); *H01L 27/14636* (2013.01); *H01L 27/14694* (2013.01); *H01L 31/035236* (2013.01)

(58) Field of Classification Search
  CPC ....... H01L 31/03042; H01L 31/035236; H01L 27/1464
  See application file for complete search history.

(56) References Cited

U.S. PATENT DOCUMENTS

2009/0020700 A1* 1/2009 Braunstein ............ B82Y 20/00
250/332

OTHER PUBLICATIONS

F. Rutz et al., "InAs/GaSb superlattice focal plane array infrared detectors: manufacturing aspects", Proc. of SPIE vol. 7298, 72981R, 2009.

* cited by examiner

*Primary Examiner* — Fei Fei Yeung Lopez
(74) *Attorney, Agent, or Firm* — Smith, Gambrell & Russell, LLP.

(57) ABSTRACT

A light receiving device includes a substrate having a principal surface and a back surface, the substrate containing GaSb semiconductor co-doped with a p-type dopant and an n-type dopant; a stacked semiconductor layer disposed on the principal surface of the substrate, the stacked semiconductor layer including an optical absorption layer; and an incident surface provided on the back surface of the substrate that receives an incident light. The optical absorption layer includes a super-lattice structure including a first semiconductor layer and a second semiconductor layer that are alternately stacked. In addition, the first semiconductor layer contains gallium and antimony as constituent elements. The second semiconductor layer is composed of a material different from a material of the first semiconductor layer.

10 Claims, 8 Drawing Sheets

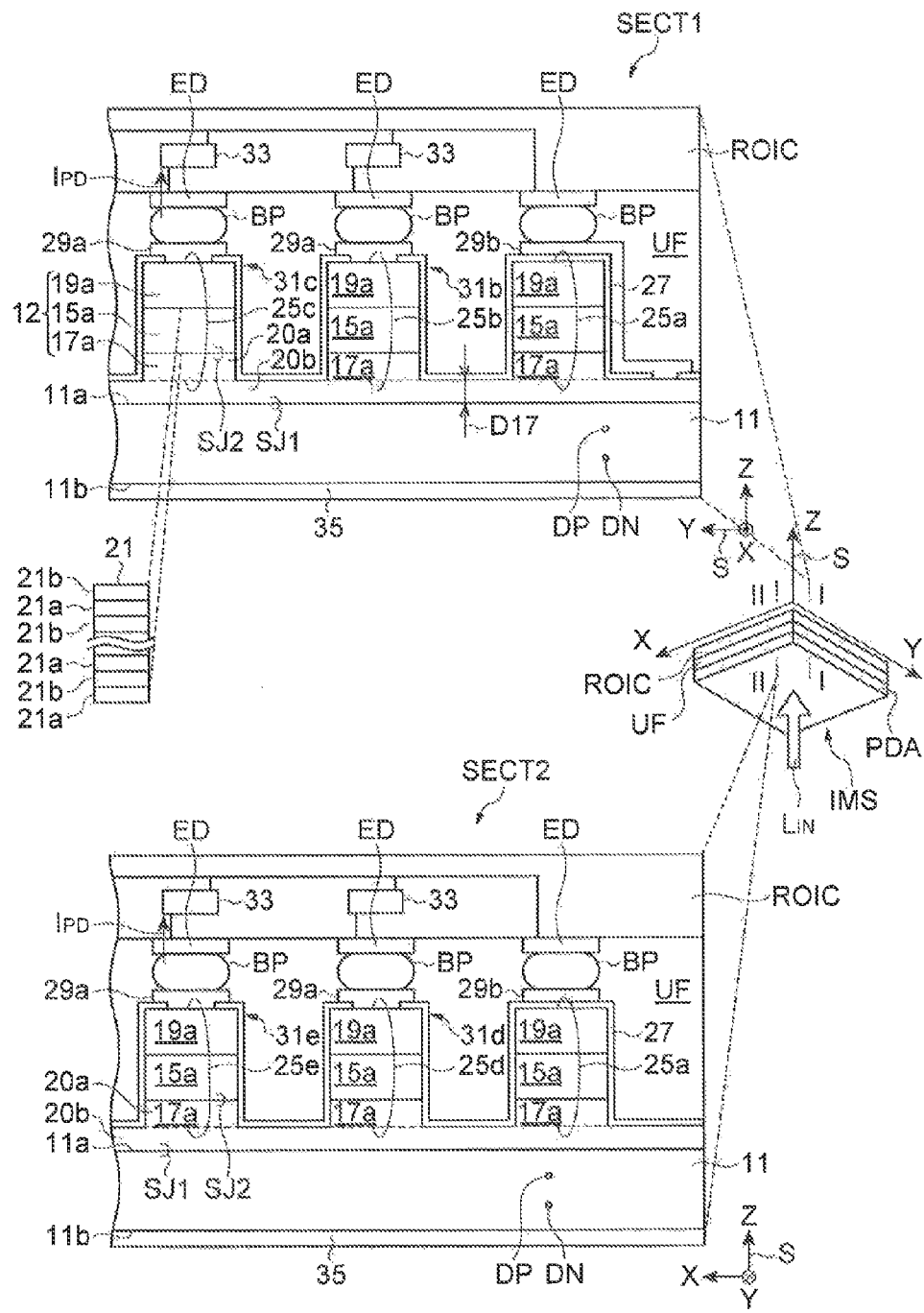

LIGHT RECEIVING DEVICE AND IMAGE SENSOR

BACKGROUND OF THE INVENTION

1. Field of the Invention

The present invention relates to a light receiving device and an image sensor including the light receiving device.

2. Description of the Related Art

Non-patent literature (F. Rutz et al., "InAs/GaSb superlattice focal plane array infrared detectors: manufacturing aspects", Proc. of SPIE, USA, SPIE, April 2009, Vol. 7298, 72981R) discloses infrared detectors each including an InAs/GaSb superlattice.

SUMMARY OF THE INVENTION

A GaSb substrate is used for growing semiconductors containing antimony as a V-group element thereon. However, a GaSb substrate has a relatively large absorption coefficient for infrared light having a wavelength of 2 μm to 20 μm. Therefore, when a light receiving device formed on a GaSb substrate has an incident surface provided on a back surface of the GaSb substrate, the intensity of light passing through the GaSb substrate from the incident surface is greatly attenuated due to the optical absorption of light in the GaSb substrate. As a result, the sensitivity of the light receiving device is reduced.

A light receiving device according to an aspect of the present invention includes a substrate having a principal surface and a back surface, the substrate containing GaSb semiconductor co-doped with a p-type dopant and an n-type dopant; a stacked semiconductor layer disposed on the principal surface of the substrate, the stacked semiconductor layer including an optical absorption layer; and an incident surface provided on the back surface of the substrate that receives an incident light. The optical absorption layer includes a super-lattice structure including a first semiconductor layer and a second semiconductor layer that are alternately stacked. In addition, the first semiconductor layer contains gallium and antimony as constituent elements. The second semiconductor layer is composed of a material different from a material of the first semiconductor layer.

An image sensor according to another aspect of the present invention includes a light receiving device; and a read-out circuit connected to the light receiving device through a bump electrode, the read-out circuit including a signal processing circuit processing a photocurrent from the light receiving device. The light receiving device includes a substrate having a principal surface and a back surface, the substrate containing GaSb semiconductor co-doped with a p-type dopant and an n-type dopant; a stacked semiconductor layer disposed on the principal surface, the stacked semiconductor layer including an optical absorption layer; and an incident surface provided on the back surface of the substrate that receives an incident light. The optical absorption layer includes a super-lattice structure including a first semiconductor layer and a second semiconductor layer that are alternately stacked. The first semiconductor layer contains gallium and antimony as constituent elements. The second semiconductor layer is composed of a material different from a material of the first semiconductor layer.

The above-described objects and other objects, characteristics, and advantages of the present invention are more easily made apparent from the detailed description made below of preferred embodiments of the present invention with reference to attached drawings.

BRIEF DESCRIPTION OF THE DRAWINGS

FIG. 1 is a drawing schematically showing an image sensor according to an embodiment of the present invention.

DESCRIPTION OF THE PREFERRED EMBODIMENTS

Figure 2A:
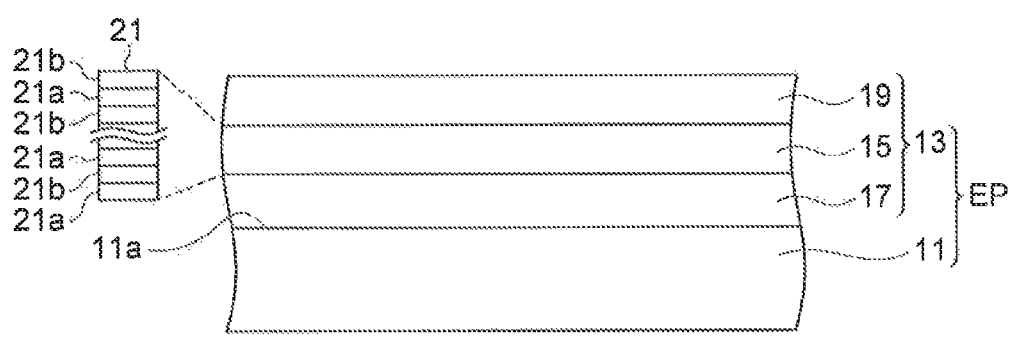
FIGS. 2A and 2B are drawings schematically showing main steps of a method for manufacturing a light receiving device according to an embodiment of the present invention.

Some embodiments are described below.

A light receiving device according to an embodiment includes (a) a substrate having a principal surface and a back surface, the substrate containing GaSb semiconductor co-doped with a p-type dopant and an n-type dopant; (b) a stacked semiconductor layer disposed on the principal surface of the substrate, the stacked semiconductor layer including an optical absorption layer; and (c) an incident surface provided on the back surface of the substrate that receives an incident light. The optical absorption layer includes a super-lattice structure including a first semiconductor layer and a second semiconductor layer that are alternately stacked. In addition, the first semiconductor layer contains gallium and antimony as constituent elements. The second semiconductor layer is composed of a material different from a material of the first semiconductor layer.

In the light receiving device, the stacked semiconductor layer is disposed on the principal surface of the substrate. The substrate contains GaSb semiconductor co-doped with the p-type dopant and the n-type dopant. In the co-doped GaSb semiconductor, carrier compensation occurs so as to decrease the carrier concentration in the GaSb semiconductor. In addition, the light receiving device includes the incident surface provided on the back surface of the substrate that receives an incident light. When an incident light containing infrared light is incident to the incident surface, the infrared light in the incident light is transmitted through the substrate to the optical absorption layer without being absorbed in the substrate. In the optical absorption layer, photo-carriers are efficiently generated, and then move to an electrode of the light receiving device so as to be output as the photocurrent.

In the light receiving device according to an embodiment, the GaSb semiconductor constituting the substrate may have a carrier concentration in a range of $1 \times 10^{16}$ cm$^{-3}$ or less and $1 \times 10^{13}$ cm$^{-3}$ or more.

In the light receiving device, the substrate having the low carrier concentration in a range of $1\times10^{16}$ cm$^{-3}$ or less and $1\times10^{13}$ cm$^{-3}$ or more is used so as to decrease the optical absorption coefficient for the infrared light. Therefore, the substrate shows good light transmittance in the infrared wavelength region In the light receiving device according to an embodiment, preferably, the p-type dopant is doped into the GaSb semiconductor at an impurity concentration in a range of $1\times10^{17}$ cm$^{-3}$ or more and $1\times10^{18}$ cm$^{-3}$ or less, and the n-type dopant is doped into the GaSb semiconductor at an impurity concentration in a range of $1\times10^{17}$ cm$^{-3}$ or more and $1\times10^{18}$ cm$^{-3}$ or less.

In the light receiving device according to an embodiment, the GaSb semiconductor constituting the substrate may contain zinc as the p-type dopant and tellurium as the n-type dopant.

The light receiving device according to an embodiment may further include an antireflection film provided on the incident surface on the back surface of the substrate. In the light receiving device, the antireflection film reduces a reflection of the incident light at the incident surface on the back surface of the substrate.

In the light receiving device according to an embodiment, the substrate may have a thickness of 500 µm or more, and 1000 µm or less.

An image sensor according to another embodiment includes a light receiving device; and a read-out circuit connected to the light receiving device through a bump electrode, the read-out circuit including a signal processing circuit processing a photocurrent from the light receiving device. The light receiving device includes a substrate having a principal surface and a back surface, the substrate containing GaSb semiconductor co-doped with a p-type dopant and an n-type dopant; a stacked semiconductor layer disposed on the principal surface, the stacked semiconductor layer including an optical absorption layer; and an incident surface provided on the back surface of the substrate that receives an incident light. The optical absorption layer includes a super-lattice structure including a first semiconductor layer and a second semiconductor layer that are alternately stacked. The first semiconductor layer contains gallium and antimony as constituent elements. The second semiconductor layer is composed of a material different from a material of the first semiconductor layer.

In the image sensor, the light receiving device includes the substrate containing GaSb semiconductor co-doped with the p-type dopant and the n-type dopant and the stacked semiconductor layer disposed on the substrate. The substrate has a small optical absorption coefficient because carrier compensation occurs due to the p-type and n-type dopants in the co-doped GaSb semiconductor. When an incident light containing an infrared light is incident to the incident surface provided on the back surface of the substrate, the infrared light is transmitted through the substrate without being absorbed in the substrate, and efficiently reaches the optical absorption layer. Therefore, the light receiving device having a large light receiving sensitivity for the infrared light is obtained. Photo-carriers generated in the optical absorption layer move to an electrode of the light receiving device so as to output a photocurrent. In the image sensor, the light receiving device is connected to the read-out circuit (ROIC) through the bump electrode. The photocurrent output from the light receiving device is provided to the read-out circuit (ROIC), and is processed in the signal processing circuit in the read-out circuit (ROIC).

The knowledge of the present invention can be easily understood by consideration of the detailed description below with reference to the attached drawings shown as an example. Then, a light receiving device, an image sensor including the light receiving device, a method for manufacturing a light receiving device, and a method for manufacturing an image sensor including the light receiving device according to embodiments are described with reference to the attached drawings. If possible, the same portion is denoted by the same reference numeral.

FIG. 1 is a drawing schematically showing an image sensor according to an embodiment. FIG. 1 is a schematic perspective view of components of an image sensor IMS. FIG. 1 also shows across section (SECT 1) of the image sensor IMS taken along line I-I, and a cross section (SECT 2) of the image sensor IMS taken along line II-II. These sectional views are not hatched in order to avoid complication of the drawing. FIG. 1 further shows a rectangular coordinate system S. The cross section taken along line I-I is defined to be parallel with the X-Z plane. The cross section taken along line II-II is defined to be parallel with the Y-Z plane.

The image sensor IMS includes a light receiving device PDA and a read-out circuit (ROIC) including a silicon integrated circuit (IC). The light receiving device PDA includes a GaSb substrate 11 and a stacked semiconductor layer 12 formed on the GaSb substrate 11. The GaSb substrate 11 contains a GaSb semiconductor co-doped with a p-type dopant DP and an n-type dopant DN. The GaSb substrate 11 has a principal surface 11a and a back surface 11b opposite to the principal surface 11a. The stacked semiconductor layer 12 is grown on the principal surface 11a of the GaSb substrate 11. The back surface 11b includes an incident surface that receives incident light $L_{IN}$ containing infrared light. The stacked semiconductor layer 12 includes an optical absorption layer 15a in which photo-carriers are generated in receiving the infrared light in the incident light $L_{IN}$. The optical absorption layer 15a is made of a III-V group compound semiconductor containing antimony as a V-group element. The co-doped GaSb substrate is transparent to light in a wavelength range of 2 to 15 micrometers. Therefore, a light receiving device having a large sensitivity for light within the wavelength range of 2 to 15 micrometers is obtained by using the co-doped GaSb substrate. The light receiving device PDA includes one or a plurality of photodiodes 31b to 31e. Each of the photodiodes 31b to 31e in the light receiving device PDA includes the stacked semiconductor layer 12 including an optical absorption layer 15a thrilled on the co-doped GaSb substrate 11. The read-out circuit ROIC is connected to the light receiving device PDA through bump electrodes BP. The read-out circuit ROIC includes an array of signal processing circuits 33 corresponding to an array of the plurality of photodiodes 31b to 31e in the light receiving device PDA. The signal processing circuits 33 of the read-out circuit ROIC process a photocurrent $I_{PD}$ produced from the light receiving device PDA.

In the image sensor IMS, the GaSb substrate 11 includes GaSb semiconductor co-doped with the p-type dopant DP and the n-type dopant DN. In the co-doped GaSb semiconductor, carriers produced by the p-type dopant DP and the n-type dopant DN are compensated by each other (carrier compensation). The carrier compensation decreases the carrier concentration in the GaSb semiconductor. Therefore, optical absorption (carrier absorption) caused by the carriers in the semiconductor is decreased. In the embodiment, in the light receiving device PDA, the back surface 11b of the GaSb substrate 11 includes the incident surface that receives the incident light $L_{IN}$ containing infrared light. The co-doped GaSb substrate is transparent to infrared light in a wavelength range of 2 to 15 micrometers because the co-doped GaSb substrate has a small optical absorption coefficient for the infrared light. Therefore, the infrared light contained in the incident light $L_{IN}$ is transmitted through the co-doped GaSb substrate 11, and efficiently reaches the optical absorption layer 15a without being absorbed in the GaSb substrate 11. In the optical absorption layer 15a, photo-carriers are generated, and then move to an electrode of the light receiving device PDA so as to be output as the photocurrent $I_{PD}$. The photocurrent $I_{PD}$ from the light receiving device PDA is provided to the read-out circuit ROIC through the bump electrodes BP. Then, the photocurrent $I_{PD}$ is processed by the signal processing circuits 33 of the read-out circuit ROIC. The read-out circuit ROIC includes a silicon integrated circuit.

As shown in FIG. 1, electrodes 29a and 29b of the light receiving device PDA are bonded to electrodes ED of the read-out circuit ROIC through the bump electrodes BP by using a flip-chip bonding method. The spaces between the light receiving device PDA and the read-out circuit ROIC including the signal processing circuits 33 are filled with an underfill resin UF. If required, an antireflection film 35 may be provided on the back surface 11b of the GaSb substrate 11. The antireflection film 35 is composed of, for example, a dielectric film such as a $SiO_2$ film or SiN film. The antireflection film 35 reduces a reflection of the incident light $L_{IN}$ at the back surface 11b of the GaSb substrate 11. The thickness of the GaSb substrate 11 is, for example, 200 μm or more. The GaSb substrate 11 contains zinc (Zn) as the p-type dopant and tellurium (Te) as the n-type dopant, for example. Co-doping of p-type dopant and n-type dopant causes carrier compensation in the GaSb semiconductor. The carrier concentration in the co-doped GaSb substrate 11 is controlled in a range of, for example, $1\times10^{16}$ cm$^{-3}$ or less and $1\times10^{13}$ cm$^{-3}$ or more. For example, in order to obtain the carrier concentration in the co-doped GaSb substrate 11, the p-type dopant concentration is controlled in a range of, for example, $1\times10^{17}$ cm$^{-3}$ or more and $1\times10^{18}$ can or less. Also, the n-type dopant concentration is controlled in a range of for example, $1\times10^{17}$ cm$^{-3}$ or more and $1\times10^{18}$ cm$^{-3}$ or less. In addition, the p-type dopant in GaSb is not limited to Zn, and for example, Be may be used as a p-type dopant. Also, the n-type dopant in GaSb is not limited to Te. In order to realize good carrier compensation, the ratio between the p-type dopant concentration and the n-type dopant concentration is controlled in a range of, for example, 0.1 to 10.

The stacked semiconductor layer 12 includes a first conduction-type semiconductor layer 17a and the optical absorption layer 15a formed on the first conduction-type semiconductor layer 17a. The optical absorption layer 15a produces photo-carriers due to the absorption of the infrared light in the incident light $L_{IN}$. The first conduction-type semiconductor layer 17a is composed of a III-V group compound semiconductor and is disposed between the optical absorption layer 15a and the GaSb substrate 11. The first conduction-type semiconductor layer 17a is provided on the principal surface 11a of the GaSb substrate 11. In the embodiment, the first conduction-type semiconductor layer 17a is in contact with the principal surface 11a of the GaSb substrate 11. A junction SE is formed between the first conduction-type semiconductor layer 17a and the principal surface 11a of the GaSb substrate 11. Also, the optical absorption layer 15a is in contact with the first conduction-type semiconductor layer 17a. A junction SJ2 is formed between the optical absorption layer 15a and the first conduction-type semiconductor layer 17a.

The optical absorption layer 15a includes, for example, a super-lattice structure 21. The super-lattice structure 21 includes a first semiconductor layer 21a and a second semiconductor layer 21b which are alternately stacked. The first semiconductor layer 21a contains gallium and antimony as constituent elements. The second semiconductor layer 21b is composed of a material different from a material of the first semiconductor layer 21a.

If required, the stacked semiconductor layer 12 may include a second conduction-type semiconductor layer 19a provided on the optical absorption layer 15a. The second conduction-type semiconductor layer 19a is composed of a III-V group compound semiconductor. The conductivity of the first conduction-type semiconductor layer 17a is opposite to the conductivity of the second conduction-type semiconductor layer 19a. Examples of the GaSb substrate 11 and the stacked semiconductor layer 12 are as follows.

GaSb substrate 11: co-doped GaSb substrate

First conduction-type semiconductor layer 17a: p-type GaSb/InAs super-lattice

Super-lattice structure 21 of optical absorption layer 15a (number of repetitions: 50 layers to 500 layers)

First semiconductor layer 21a: GaSb (thickness: 1 nm to 5 nm)

Second semiconductor layer 21b: InAs (thickness: 1 nm to 5 nm)

Second conduction-type semiconductor layer 19a: n-type GaSb/InAs super-lattice The super-lattice structure 21 is not limited to the GaSb/InAs super-lattice. The super-lattice structure 21 may include an InGaAs/GaAsSb super-lattice structure or an InAs/InAsSb super-lattice structure. The thickness of the stacked semiconductor layer 12 is, for example, 1 to 6 micrometers.

As shown in FIG. 1, the light receiving device PDA includes a plurality of semiconductor mesas 25a, 25b, 25c, 25d, and 25e formed on the GaSb substrate 11. Each of the semiconductor mesas 25a, 25b, 25c, 25d, and 25e includes the stacked semiconductor layer 12 that includes the first conduction-type semiconductor layer 17a, the optical absorption layer 15a, and the second conduction-type semiconductor layer 19a. Each of the semiconductor mesas 25a to 25e includes the junction SJ2 but not the junction SJ1. Therefore, the bottom of each of the semiconductor mesas 25a to 25e is located in the middle of the first conduction-type semiconductor layer 17a. The semiconductor mesas 25a to 25e are electrically connected to each other through the first conduction-type semiconductor layer 17a. The first conduction-type semiconductor layer 17a includes a first portion 20a and a second portion 20b. The first portion 20a is included in each of the semiconductor mesas 25a to 25e, while the second portion 20b extends along the principal surface 11a of the GaSb substrate 11. In the embodiment, the semiconductor mesas 25a to 25e are disposed on the second portion 20b of the first conduction-type semiconductor layers 17a. The dopant concentration in the second portion 20b of the first conduction-type semiconductor layer 17a is for example, $1\times10^{17}$ cm$^{-3}$ or more. The dopant concentration in the first portion 20a is controlled to the same as the second portion 20b. The thickness D17 of the second portion 20b is, for example, 0.5 micrometers or more and 3 micrometers or less.

The light receiving device PDA includes a passivation film 27 which covers the upper surfaces and side surfaces of the semiconductor mesas 25a to 25e. The passivation film 27 has an opening disposed on the upper surface of each of the semiconductor mesas 25b to 25e. In addition, electrodes 29a (for example, n-side electrodes) of the photodiodes 31b to 31e are provided in the openings corresponding to the respective semiconductor mesas 25b to 25e. The passivation film 27 has another opening in a region different from a region on the semiconductor substrate in which the semiconductor mesas 25a to 25e are formed. Another electrode 29b (for example, a p-side electrode) common to the photodiodes 31b to 31e is provided in the other opening. The other electrode 29b is extended on the passivation film 27 up to the upper surface of the semiconductor mesa 25a. In the embodiment, each of the electrodes 29a makes ohmic contact with an underlying semiconductor, specifically, the second conduction-type semiconductor layer 19a. The other electrode 29b makes ohmic contact with an underlying semiconductor, specifically, the second portion 20b of the first conduction-type semiconductor layers 17a.

The bump electrode BP (for example, indium (In) bump) is provided on each of the electrodes 29a and the other electrode 29b. In the embodiment, the light receiving device PDA includes an array of the photodiodes 31b to 31e which are arranged two-dimensionally in the X-axis direction and the Y-axis direction of the rectangular coordinate system S. The photodiodes 31b to 31e correspond to the arrangement of the semiconductor mesas 25b to 25e. In the embodiment, a two-dimensional photodiode arrangement is described, but a one-dimensional photodiode arrangement may be used.

Next, a method for manufacturing the image sensor IMS and the light receiving device PDA will be briefly described. In description below, in order to facilitate the understanding, if possible, portions corresponding to the image sensor IMS and the light receiving device PDA are denoted by the same reference numerals as the components of the image sensor IMS and the light receiving device PDA.

FIGS. 2A to 5B are drawings each schematically showing a main step of a method for manufacturing the light receiving device according to the embodiment. A GaSb substrate used for epitaxially growing semiconductor layers is prepared. As already described above, the material of the GaSb substrate is GaSb semiconductor co-doped with a p-type dopant DP and an n-type dopant DN. The co-doped GaSb substrate is cut out from a co-doped GaSb crystal (ingot) grown by using a Czochralski method, for example. A GaSb wafer cut out from the co-doped GaSb crystal (ingot) has a carrier concentration of, for example, $1 \times 10^{13}$ cm$^{-3}$ or more and $1 \times 10^{16}$ cm$^{-3}$ or less. In the subsequent description, in order to facilitate the understanding, a substrate used for epitaxial growth in the manufacturing method is referred to as a "GaSb substrate 11". As shown in FIG. 2A, raw materials are supplied to a growth furnace to grow a stacked semiconductor region 13 on the principal surface 11a of the GaSb substrate 11. The stacked semiconductor region 13 is grown by using, for example, a molecular beam epitaxial growth (MBE) method or a metal-organic vapor phase epitaxy (MOVPE) method. The stacked semiconductor region 13 includes a semiconductor layer 15 for forming the optical absorption layers 15a and a first conduction-type semiconductor layer 17 for forming the first conduction-type semiconductor layers 17a. The first conduction-type semiconductor layer 17 is provided between the semiconductor layer 15 and the GaSb substrate 11, if required, the stacked semiconductor region 13 may include a second conduction-type semiconductor layer 19 grown on the semiconductor layer 15. The semiconductor layer 15 includes, for example, a super-lattice structure 21 as the optical absorption layer 15a. The super-lattice structure 21 has, for example, a type II band structure. The super-lattice structure 21 includes a first semiconductor layer 21a and a second semiconductor layer 21b which are alternately stacked. The first semiconductor layer 21a contains gallium and antimony as constituent elements. The second semiconductor layer 21b is composed of a material different from a material of the first semiconductor layer 21a. An epitaxial wafer EP including the GaSb substrate 11 and the stacked semiconductor region 13 is formed by the steps described above.

The light receiving device manufactured in the embodiment has a mesa-type structure. However, the light receiving device may have a planar-type structure. In manufacturing a light receiving device having a planar-type structure, semiconductor mesas are not formed. Then, a selective diffusion mask is formed on the epitaxial wafer EP including the stacked semiconductor region 13 so as to be aligned to an array of photodiodes. The selective diffusion mask is made of, for example, a dielectric film of SiN or SiO$_2$. Then, p-type regions are formed by, for example, selectively diffusing zinc (Zn) using the selective diffusion mask. Then, electrodes are formed in an array on the p-type regions of the photodiodes. Further, another electrode common to the array of the photodiodes is formed.

Figure 2B:
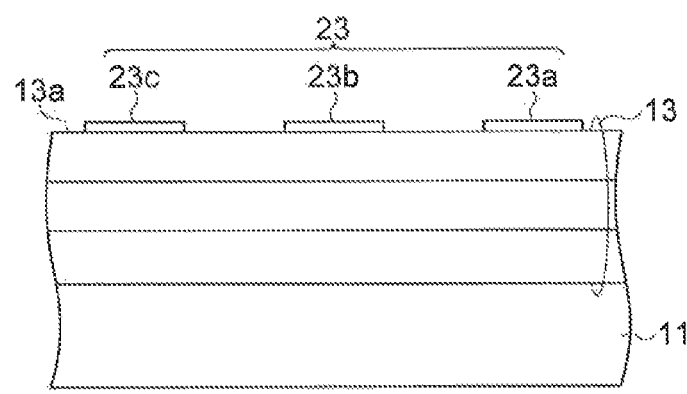

The epitaxial wafer EP is taken out from the growth furnace, and then a mask for forming semiconductor mesas is formed on the stacked semiconductor region 13. First, an insulating film is formed on a principal surface 13a the stacked semiconductor region 13 by using a chemical vapor deposition (CVD) method, for example. The insulating film is made of a silicon nitride (SiN) film, a silicon dioxide (SiO$_2$) film, or a silicon oxy-nitride (SiON) film, for example. In the embodiment, a silicon nitride film is formed on the principal surface 13a of the stacked semiconductor region 13. The thickness of the silicon nitride film is, for example, 300 nm to 800 nm. Then, a pattern for forming semiconductor mesas is formed in the insulating film by using a photolithography method and an etching method. As a result, as shown in FIG. 2B, a mask 23 for forming semiconductor mesas is formed. The mask 23 has a one-dimensional or two-dimensional pattern (23a, 23b, 23c) arrangement corresponding to an arrangement of semiconductor mesas. The mask 23 is composed of, for example silicon nitride. The substrate product produced by this step is provided with the epitaxial wafer EP and the mask 23.

Figure 3A:
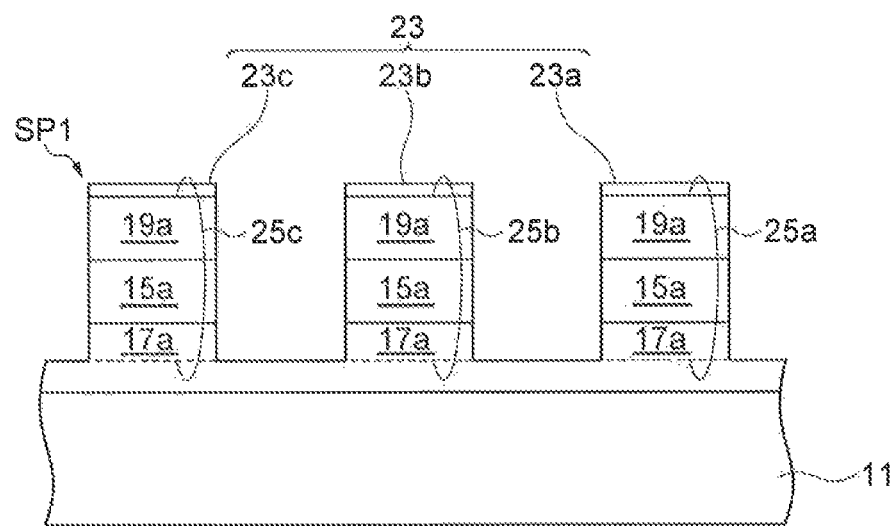
FIGS. 3 and 3B are drawings schematically showing main steps of a method for manufacturing a light receiving device according to an embodiment of the present invention.

After the mask 23 is formed, the epitaxial wafer EP is placed in an etching apparatus. As shown in FIG. 3A, a substrate product SP1 is formed by etching the epitaxial wafer EP using the mask 23. The super-lattice structure 21 of the semiconductor layer 15 is etched by, for example, a dry etching process. In the dry etching process, a halogen gas (for example, Cl$_2$, BCl$_3$, HI, or SiCl$_4$) or a mixed gas containing a hydrocarbon gas (for example, methane gas) and a hydrogen gas is used as an etching gas, for example.

Referring to FIG. 3A, the substrate product SP1 includes the semiconductor mesas 25a, 25b, and 25c which are formed from the stacked semiconductor region 13 by dry etching. The semiconductor mesas 25a, 25b, and 25c correspond to the patterns 23a, 23b, and 23c of the mask 23, respectively. Each of the semiconductor mesas 25a, 25b, and 25c includes the first conduction-type semiconductor layer 17a formed from the first conduction-type semiconductor layer 17, the optical absorption layer 15a formed from the semiconductor layer 15, and the second conduction-type semiconductor layer 19a formed from the second conduction-type semiconductor layer 19. The optical absorption layers 15a have the same super-lattice structure as the semiconductor layer 15. Each of the optical absorption layers 15a is provided between the first conduction-type semiconductor layer 17a and the second conduction-type semiconductor layer 19a. The height of the semiconductor mesas 25a, 25b, and 25c is, for example, 1 to 5 μm corresponding to the thickness of the stacked semiconductor region 13.

The substrate product SP1 is taken out from the etching apparatus, and then the mask 23 is removed. The mask 23 composed of, for example, silicon nitride is removed by using buffered hydrofluoric acid. A substrate product SP2 is produced by removing the mask 23 from the substrate product SP1.

Figure 3B:
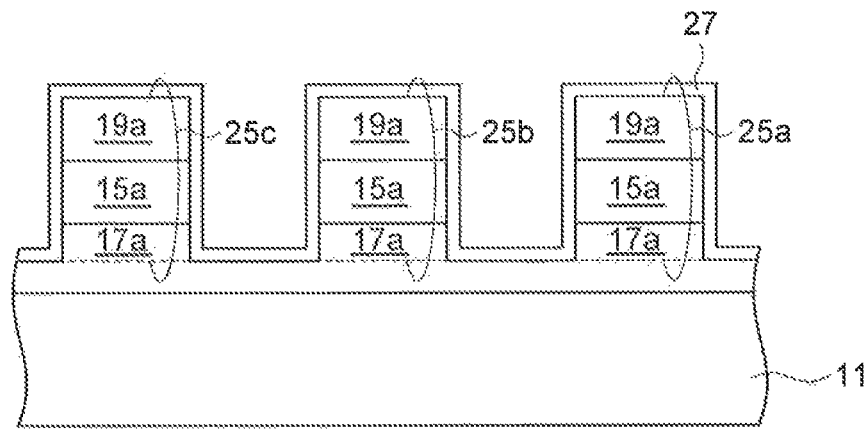

After the mask 23 is removed, as shown in FIG. 3B, a passivation film 27 is formed on the substrate product SP2 by using a CVD method in a deposition apparatus. The thickness of the passivation film 27 is, for example, 100 nm to 500 nm. In the CVD method for forming the passivation film 27, silane gas and nitrous oxide gas are supplied in the deposition apparatus as raw material gas, for example. In the embodiment, the passivation film 27 is composed of silicon oxide ($SiO_2$). The passivation film 27 may be composed of for example, silicon oxy-nitride (SiON), or aluminum oxide ($Al_2O_3$).

Figure 4:
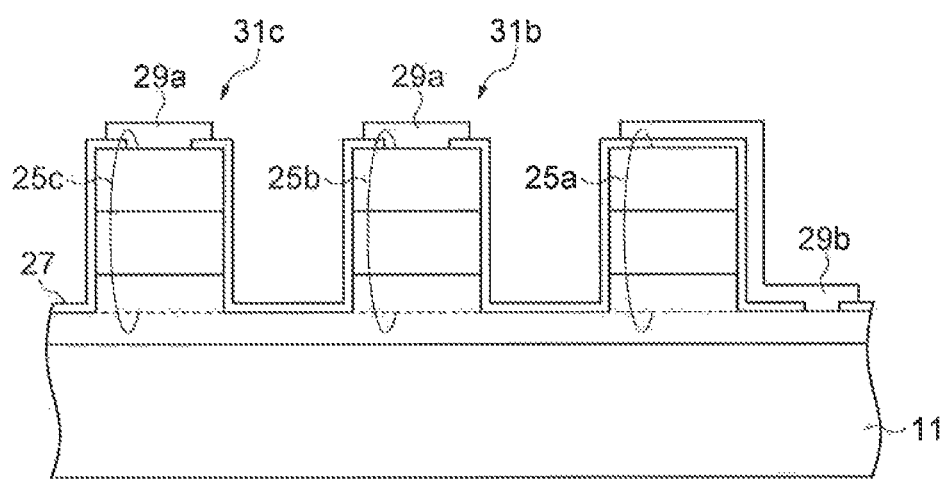
FIG. 4 is a drawing schematically showing a main step of a method for manufacturing a light receiving device according to an embodiment of the present invention.

The method for manufacturing the light receiving device is continuously described. As shown in FIG. 4, an opening is formed in the passivation film 27 corresponding to each of the semiconductor mesas 25b and 25c. Also, an electrode 29a (one of an anode electrode and a cathode electrode) of each of photodiodes 31b and 31c is formed in the opening corresponding to each of the semiconductor mesas 25b and 25c. The electrode 29a has, for example, a Ti/Pt/Au/Ni/Au five-layer structure formed in order on the semiconductor layer. The electrode 29a is formed by, for example, a lift-off method. Further, another opening is formed in the passivation film 27 on the upper surface of a semiconductor region different from the region of the semiconductor mesas 25a, 25b, and 25c on the substrate. In addition, the other electrode 29b (the other of the anode electrode and the cathode electrode) common to the photodiodes 31b and 31c is formed in the other opening. The other electrode 29b is extended to the upper surface of the semiconductor mesa 25a. The other electrode 29b has, for example, a Ti/Pt/Au layer structure formed in order on the semiconductor layer. The electrode 29b is formed by, for example, a lift-off method.

Figure 5A:
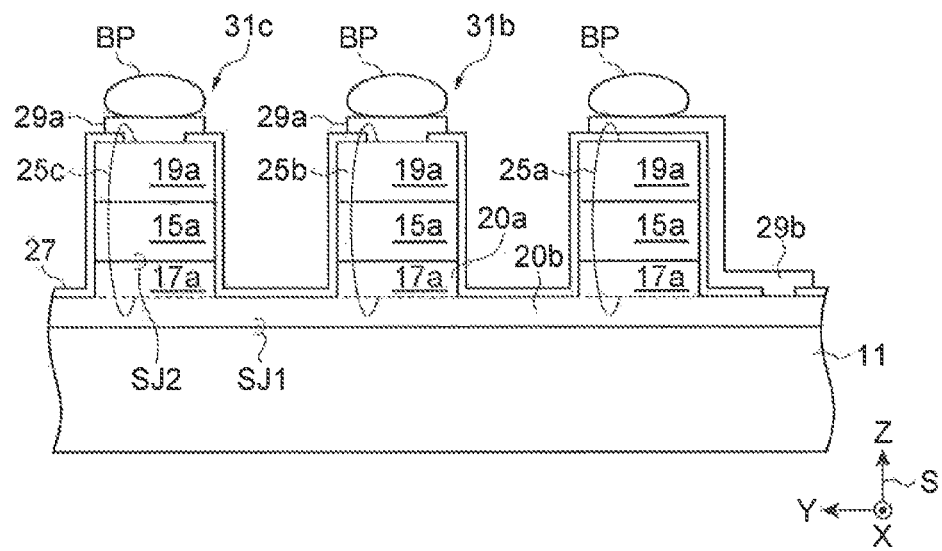
FIGS. 5A and 5B are drawings schematically showing main steps of a method for manufacturing a light receiving device according to an embodiment of the present invention.
Figure 5B:
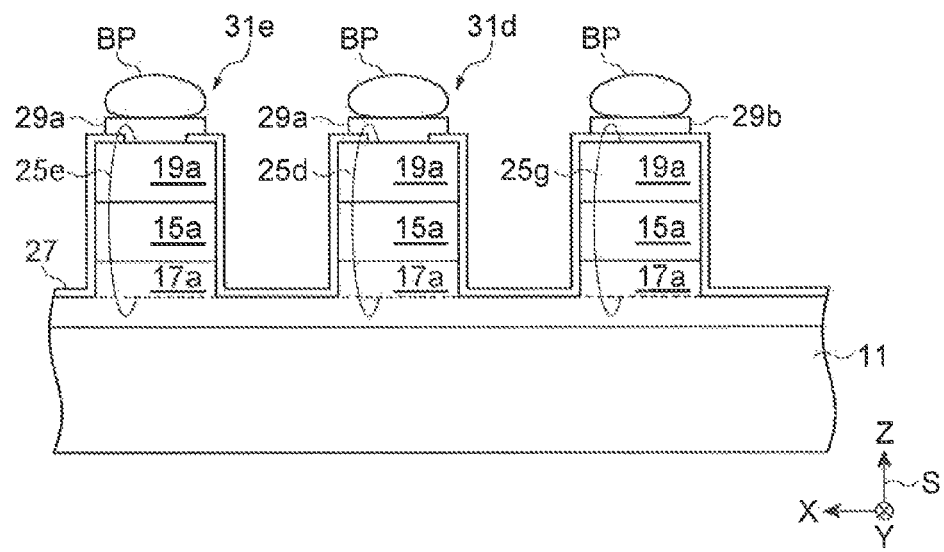

If required, after the steps described above, the bump electrodes BP (for example, indium (In) bumps) are formed on the electrode 29a and the other electrode 29b. The In bump electrodes are formed by, for example, a lift-off method. Then, a chip is cut out from the substrate product by dicing, thereby forming the light receiving device PDA including a photodiode array as shown in FIGS. 5A and 5B. The light receiving device PDA includes an array of photodiodes 31b to 31e which are arranged two-dimensionally in the X-axis direction and the Y-axis direction of the rectangular coordinate system S. The photodiodes 31b to 31e correspond to an arrangement of the semiconductor mesas 25b to 25e. Then, the electrodes (29a, 29b) of the light receiving device PDA are bonded to electrodes ED (refer to FIG. 1) of the read-out circuit ROIC through the bump electrodes BP. The spaces between the light receiving device PDA and the read-out circuit ROIC are filled with an under-fil resin. An under-fil resin UF (refer to FIG. 1) is formed by heat-curing the under-fil resin, in the manufacturing steps described above, the co-doped GaSb substrate (GaSb wafer) is used for the substrate on which the stacked semiconductor region 13 is grown. In addition, the back surface of the co-doped GaSb substrate (GaSb wafer) serves as an incident surface of the light receiving device PDA. By using the co-doped GaSb substrate, an optical absorption for infrared light passing through the GaSb substrate is decreased. Therefore, it is unnecessary to grind or polish the substrate to reduce the thickness of the substrate for decreasing the optical absorption. Also, the co-doped GaSb substrate (GaSb wafer) having a relatively large thickness is easily handled. However, if required, the co-doped GaSb substrate may be thinned by applying processing such as polishing or grinding to the co-doped GaSb substrate in order to further suppress the optical absorption of incident light. In order to form an incidence surface, the back surface of the GaSb substrate may be polished. The thickness of the co-doped GaSb substrate is 200 μm or more. Preferably, the thickness of the co-doped GaSb substrate is 500 μm or more, and 1000 μm or less.

Figure 6:
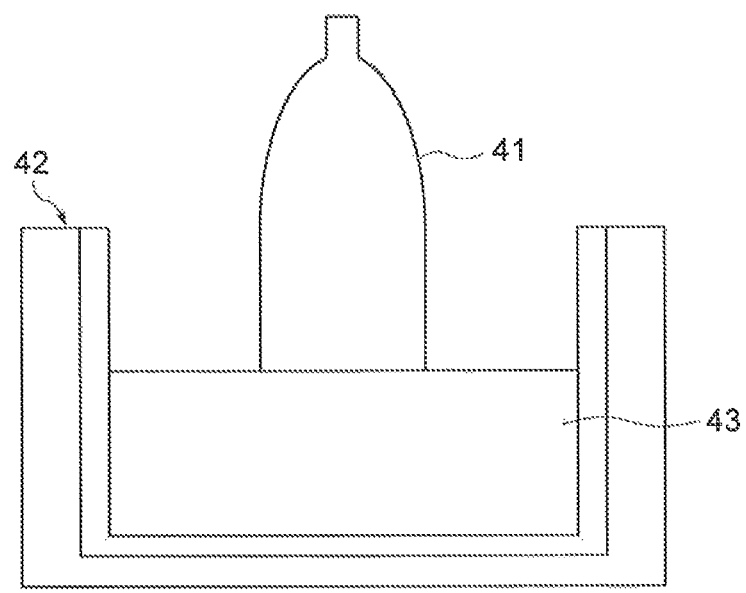
FIG. 6 is a drawing schematically illustrating a method for manufacturing a co-doped GaSb substrate.

FIG. 6 is a drawing illustrating a method for manufacturing the co-doped GaSb substrate. The co-doped GaSb substrate is formed by a melting growth method such as a Czochralski method. In the Czochralski method, a GaSb seed crystal 41 and a crucible 42 are prepared. A GaSb raw material is placed in the crucible 42. The GaSb is molten by heating the GaSb raw material at a temperature higher than its melting point of 712° C. In the crucible 42, for example, Zn as the p-type dopant and Te as the n-type dopant are added for co-doping. The GaSb seed crystal 41 is disposed above the crucible 42. The GaSb seed crystal 41 is brought into contact with a GaSb melt 43 containing Zn and Te. A co-doped GaSb single crystal is grown on the seed crystal 41 from the GaSb melt 43 by gradually pulling up the GaSb seed crystal 41 while rotating the crucible 42. Consequently, a GaSb single crystal ingot co-doped with the p-type and n-type dopants is formed. Then, a wafer is formed by slicing the GaSb single crystal ingot. The co-doped GaSb substrate is formed by polishing the wafer. The GaSb single crystal may also be grown by, for example, a liquid encapsulated Czochralski method (LEC method).

Figure 7:
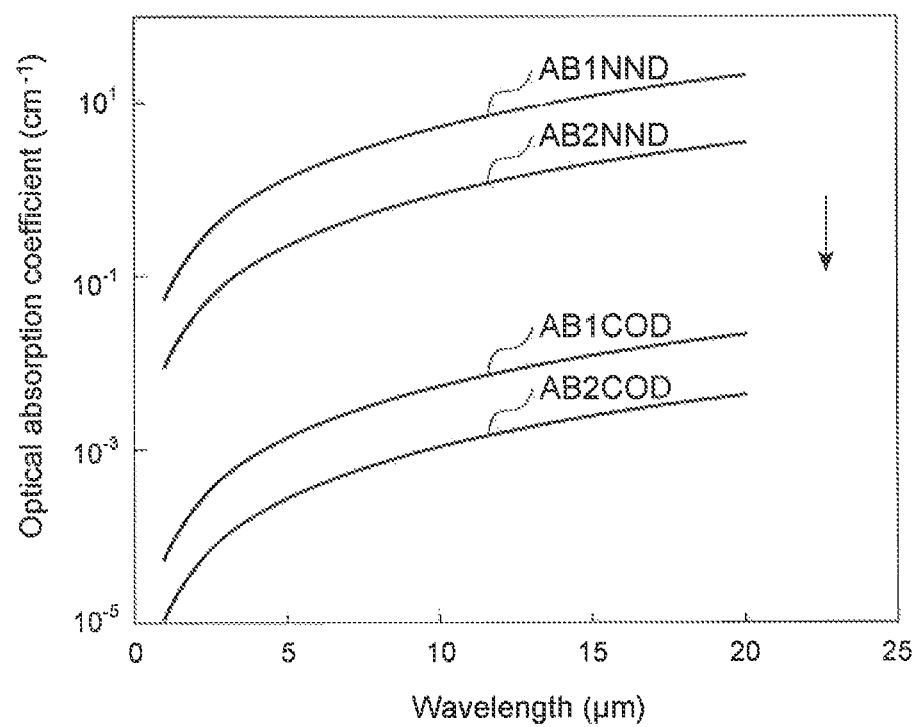
FIG. 7 is a graph showing a relationship between the light wavelength and the optical absorption coefficient of a co-doped GaSb substrate.

FIG. 7 is a graph showing a relationship between light wavelength and the optical absorption coefficient of a co-doped GaSb substrate. In order to facilitate understanding, FIG. 7 also shows a relationship between the light wavelength and the optical absorption coefficient of an undoped GaSb substrate. FIG. 7 shows the optical absorption characteristics "AB1COD" and "AB2COD" of co-doped GaSb substrates and the optical absorption characteristics "AB1NND" and "AB2NND" of un-doped GaSb substrates within a light wavelength range of 2 μm to 20 μm. The optical absorption characteristics are measured for two different co-doped GaSb substrates having a thickness of 650 μm and two different un-doped GaSb substrates having a thickness of 650 μm.

The types of the dopants in the co-doped GaSb substrate are Zn (p-type dopant) and Te (n-type dopant). The types of dopants and dopant concentrations in the co-doped GaSb substrate are shown below.

Dopant type: Dopant concentration
Zn (p-type dopant): $1\times10^{16}$ $cm^{-3}$
Te (n-type dopant): $1\times10^{17}$ $cm^{-3}$ The carrier concentration in the co-doped GaSb substrate and the carrier concentration in the un-doped GaSb substrate are shown below.

Substrate type: Carrier concentration
Co-doped GaSb substrate: $1\times10^{14}$ $cm^{-3}$
Un-doped GaSb substrate: $1\times10^{17}$ $cm^{-3}$ FIG. 7 shows that the optical absorption coefficient of the co-doped GaSb substrate is about two digits lower than that of the un-doped GaSb substrate for light having a wavelength of 2 µm to 20 µm. In the co-doped GaSb substrate, the carriers in the GaSb substrate are compensated by the p-type and n-type dopants, thereby realizing a low carrier concentration. Therefore, even when the wavelength dependence of optical absorption is taken into consideration, a sufficient low optical absorption coefficient is exhibited over a wide wavelength band including near-infrared and far-infrared regions. The ordinate of the graph of FIG. 7 is shown by a logarithmic scale. That is, the wavelength dependence of optical absorption of the co-doped GaSb substrate is decreased to about 0.1 times that of the un-doped GaSb substrate in the wavelength range of 2 µm to 20 µm. The co-doped GaSb substrate has the very low wavelength dependency of the optical absorption. Therefore, for example, the wavelength dependence of light receiving sensitivity of the light receiving device PDA is also decreased by using the co-doped GaSb substrate.

Figure 8:
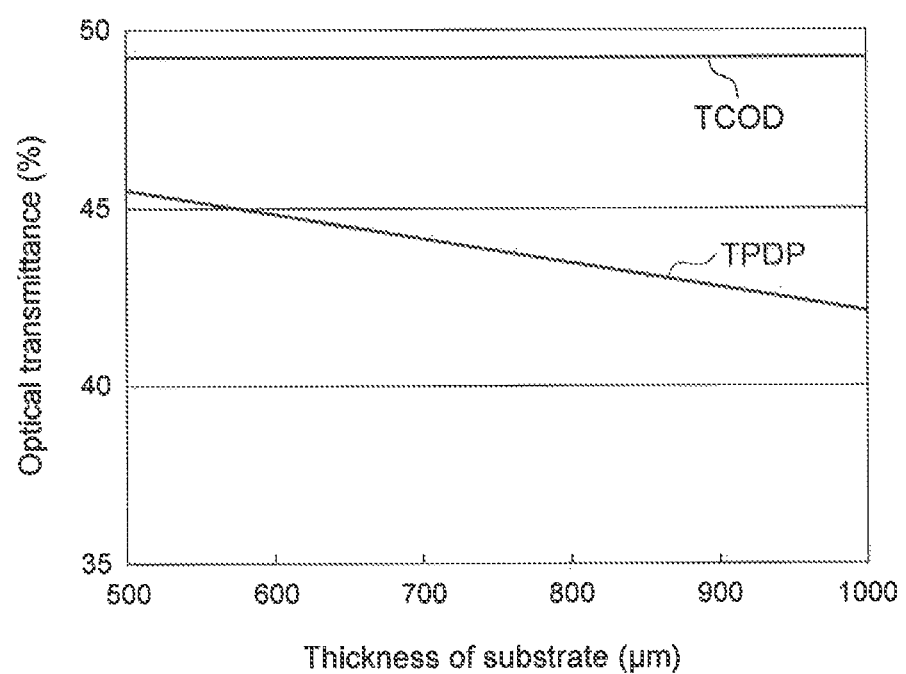
FIG. 8 is a graph showing a relationship between the thickness of a co-doped GaSb substrate and optical transmittance.

FIG. 8 is a graph showing a relationship between the thickness and light transmittance of a co-doped GaSb substrate. In order to facilitate understanding, FIG. 8 also shows a relationship between the thickness and light transmittance of a p-type GaSb substrate. FIG. 8 shows the light transmission characteristic "TCOD" of the co-doped GaSb substrate and the light transmission characteristic "TPDP" of the p-type GaSb substrate within a substrate thickness range of 500 µm to 1000 µm. The light transmission characteristic "TCOD" and the light transmission characteristic "TPDP" are measured by using light having a wavelength of 6 µm. The characteristics are measured by, for example, using Fourier transform infrared spectroscopy (FTIR). The dopant concentration is measured by, for example, using secondary ion mass spectrometry (SIMS), and the carrier concentration is measured by using a Hall measurement method.

The carrier concentrations in the co-doped GaSb substrate and the n-type GaSb substrate are shown below.
Substrate type: Carrier concentration
Co-doped GaSb substrate: $1 \times 10^{14}$ cm$^{-3}$
N-type GaSb substrate: $1 \times 10^{17}$ cm$^{-3}$
The type of dopant and dopant concentration in the co-doped GaSb substrate are shown below.
Dopant type: Dopant concentration
Zn (p-type dopant): $1 \times 10^{16}$ cm$^{-3}$
Te (n-type dopant): $1 \times 10^{17}$ cm$^{-3}$
The type of dopant and dopant concentration in the n-type GaSb substrate are shown below.
Dopant type: Dopant concentration
Te (n-type dopant): $1 \times 10^{17}$ cm$^{-3}$ As shown in FIG. 8, the n-type GaSb substrate has the light transmission characteristics in which light transmittance monotonously decreases with the thickness of the substrate. The co-doped GaSb substrate has the light transmission characteristics in which light transmittance has substantially no dependency on the thickness of the substrate. The light transmittance TCOD of the co-doped GaSb substrate is not greatly changed even when the substrate thickness is increased by two times, for example, from 500 µm to 1000 µm. The co-doped GaSb substrate has a low carrier concentration due to carrier compensation based on co-doping with the p-type and the n-type dopants. Thus, the optical absorption coefficient of the co-doped GaSb is significantly decreased due to the small carrier concentration in the GaSb semiconductor. Further, the light transmittance of the co-doped GaSb substrate does not greatly change even when the thickness of the substrate changes.

The principle of the present invention is described in the preferred embodiments with reference to the drawings, but it is recognized by a person skilled in the art that changes in the arrangement and details can be made without deviating from the principle of the present invention. The present invention is not limited to the specified configuration disclosed in the embodiments. Therefore, the present invention reserves the right to make all modifications and changes within the claims and the scope of spirit of the present invention.

What is claimed is:

1. A light receiving device comprising:
   a substrate having a principal surface and a back surface, the substrate containing GaSb semiconductor, the substrate being co-doped with a p-type &pant and an n-type dopant;
   a stacked semiconductor layer disposed on the principal surface of the substrate, the stacked semiconductor layer including an optical absorption layer; and
   an incident surface provided on the back surface of the substrate that receives an incident light,
   wherein the optical absorption layer includes a superlattice structure including a first semiconductor layer and a second semiconductor layer that are alternately stacked,
   the first semiconductor layer contains gallium and antimony as constituent elements, and
   the second semiconductor layer is composed of a material different from a material of the first semiconductor layer.

2. The light receiving device according to claim 1, wherein the substrate has a carrier concentration in a range of $1 \times 10^{16}$ cm$^{-3}$ or less and $1 \times 10^{13}$ cm$^{-3}$ or more.

3. The light receiving device according to claim 1, wherein the p-type dopant is doped into the substrate at an impurity concentration in a range of $1 \times 10^{17}$ cm$^{-3}$ or more and $1 \times 10^{18}$ cm$^{-3}$ or less, and
   the n-type dopant is doped into the substrate at an impurity concentration in a range of $1 \times 10^{17}$ cm$^{-3}$ or more and $1 \times 10^{18}$ cm$^{-3}$ or less.

4. The light receiving device according to claim 1, wherein the substrate contains zinc as the p-type dopant and tellurium as the n-type dopant.

5. The light receiving device according to claim 1, further comprising:
   an antireflection film provided on the incident surface on the back surface of the substrate.

6. The light receiving device according to claim 1, wherein the substrate has a thickness of 500 µm or more, and 1000 µm or less.

7. An image sensor comprising:
   a light receiving device; and
   a read-out circuit connected to the light receiving device through a bump electrode, the readout circuit including a signal processing circuit processing a photocurrent from the light receiving device,
   wherein the light receiving device includes:
   a substrate having a principal surface and a back surface, the substrate containing GaSb semiconductor, the substrate being co-doped with a p-type dopant and an n-type dopant;
   a stacked semiconductor layer disposed on the principal surface, the stacked semiconductor layer including an optical absorption layer; and
   an incident surface provided on the back surface of the substrate that receives an incident light, and
   wherein the optical absorption layer includes a superlattice structure including a first semiconductor layer and a second semiconductor layer that are alternately stacked, the first semiconductor layer contains gallium and antimony as constituent elements, and the second semiconductor layer is composed of a material different from a material of the first semiconductor layer.

8. The image sensor according to claim 7, wherein the substrate has a carrier concentration in a range of $1\times10^{16}$ cm$^{-3}$ or less and $1\times10^{13}$ cm$^{-3}$ or more.

9. The image sensor according to claim 7, wherein the p-type dopant is doped into the substrate at an impurity concentration in a range of $1\times10^{17}$ cm$^{-3}$ or more and $1\times10^{18}$ cm$^{-3}$ or less, and the n-type dopant is doped into the substrate at an impurity concentration in a range of $1\times10^{17}$ cm$^{-3}$ or more and $1\times10^{18}$ cm$^{-3}$ or less.

10. The image sensor according to claim 7, wherein the substrate contains zinc as the p-type dopant and tellurium as the n-type dopant.

* * * * *